United States Patent [19]

Matsuoka et al.

[11] Patent Number: 5,462,893
[45] Date of Patent: Oct. 31, 1995

[54] METHOD OF MAKING A SEMICONDUCTOR DEVICE WITH SIDEWALL ETCH STOPPER AND WIDE THROUGH-HOLE HAVING MULTILAYERED WIRING STRUCTURE

[75] Inventors: Fumitomo Matsuoka, Kawasaki; Naoki Ikeda, Yokohama, both of Japan

[73] Assignee: Kabushiki Kaisha Toshiba, Kawasaki, Japan

[21] Appl. No.: 231,974

[22] Filed: Apr. 20, 1994

Related U.S. Application Data

[62] Division of Ser. No. 939,425, Sep. 4, 1992, abandoned, which is a continuation of Ser. No. 661,605, Feb. 28, 1991, abandoned.

[30] Foreign Application Priority Data

Mar. 2, 1990 [JP] Japan ................................. 2-49500
Feb. 20, 1991 [JP] Japan ................................. 3-112658

[51] Int. Cl.$^6$ .......................................... H01L 21/44
[52] U.S. Cl. .................................... 437/195; 437/190
[58] Field of Search .................................. 437/195, 190

[56] References Cited

U.S. PATENT DOCUMENTS

| | | | |
|---|---|---|---|
| 4,556,897 | 12/1985 | Yorikane et al. | 357/68 |
| 4,561,009 | 12/1985 | Yonezawa et al. | 357/71 |
| 4,582,563 | 4/1986 | Hazuki et al. | 357/71 |
| 4,646,126 | 2/1987 | Iizuka | 357/65 |
| 4,807,013 | 2/1989 | Manocha | 257/758 |
| 4,916,521 | 4/1990 | Yoshikawa et al. | 357/68 |
| 4,931,353 | 6/1990 | Tanielian | 257/774 |
| 4,933,303 | 6/1990 | Mo | 257/774 |
| 5,036,382 | 7/1991 | Yamaha | 357/71 |

FOREIGN PATENT DOCUMENTS 0119497  9/1984  European Pat. Off. .

OTHER PUBLICATIONS

Wolf et al.; vol. I, Silicon Processing for the VLSI Era, Lattice Press, 1986 pp. 399–405.

*Primary Examiner*—Brian E. Hearn
*Assistant Examiner*—Lynne A. Gurley
*Attorney, Agent, or Firm*—Finnegan, Henderson, Farabow, Garrett & Dunner

[57] ABSTRACT

An amorphous silicon layer is used as an etch stop and is formed on the side wall of a first wiring layer having a predetermined wiring width and formed in a predetermined shape by patterning. A silicon oxide layer is covering the first wiring layer and the amorphous silicon layer, and a through-hole is formed in the silicon oxide layer so that a portion of the first wiring layer is exposed. The width of the through-hole is equal to or larger than the wiring width of the first wiring layer. A tungsten layer is filling the through-hole, and a second wiring layer connected to the tungsten layer is formed on the silicon oxide layer.

5 Claims, 7 Drawing Sheets

METHOD OF MAKING A SEMICONDUCTOR DEVICE WITH SIDEWALL ETCH STOPPER AND WIDE THROUGH-HOLE HAVING MULTILAYERED WIRING STRUCTURE

This application is a division of application Ser. No. 07/939,425, filed Sep. 4, 1992, now abandoned, which was a continuation of application Ser. No. 07/661,605, filed Feb. 28, 1991, abandoned.

BACKGROUND OF THE INVENTION

1. Field of the Invention

The present invention relates to a semiconductor device having a multilayered wiring structure and a method of manufacturing the same and, more particularly, to a semiconductor device in which different wiring layers are connected to each other via a through-hole, and a method of manufacturing the same.

2. Description of the Related Art

Figure 1A:
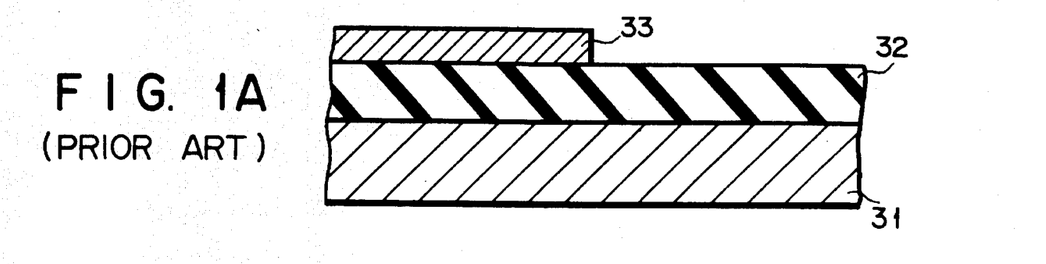
FIGS. 1A to 1D are sectional views showing a conventional manufacturing method in an order of steps.

A conventional method of manufacturing a semiconductor device having a multilayered wiring structure in which respective wiring layers are connected to each other via a through-hole will be described below with reference to FIGS. 1A to 1D. As shown in FIG. 1A, a silicon oxide film 32 as an insulating interlayer is formed on a silicon substrate 31 by a CVD (Chemical Vapor Deposition) method. Subsequently, a first aluminum layer is deposited on the entire surface of the silicon oxide film 32 and patterned to form a first wiring layer 33.

Figure 1B:
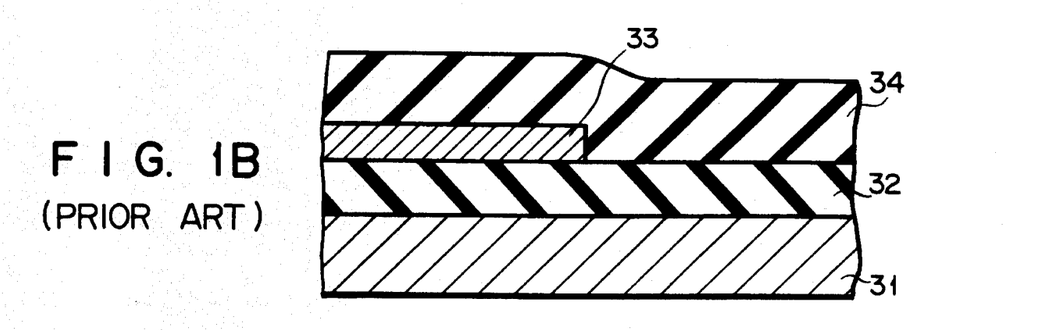
Figure 1C:
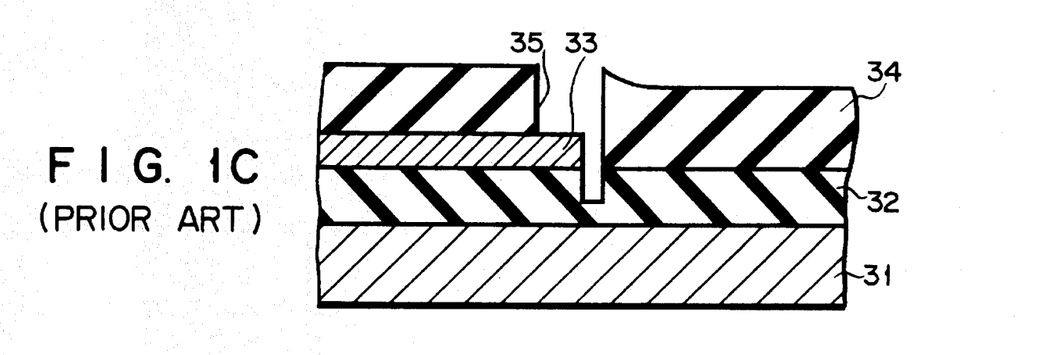
Figure 1D:
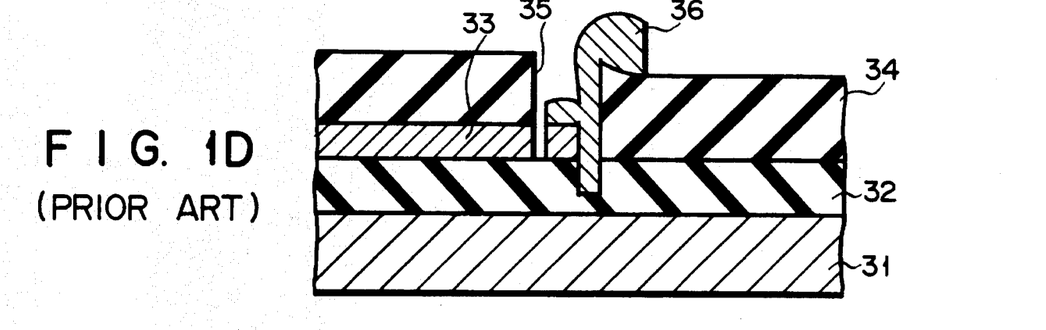

As shown in FIG. 1B, a thick silicon oxide film 34 is formed on the entire surface of the resultant structure at a low temperature of 300° C. to 380° C. by a plasma CVD method. Subsequently, as shown in FIG. 1C, the silicon oxide film 34 formed on the first wiring layer 33 is selectively removed by an RIE (Reactive Ion Etching) method using a predetermined mask, thereby forming a through-hole 35. Thereafter, a second aluminum layer is deposited on the entire surface and patterned to form a second wiring layer 36.

Figure 2:
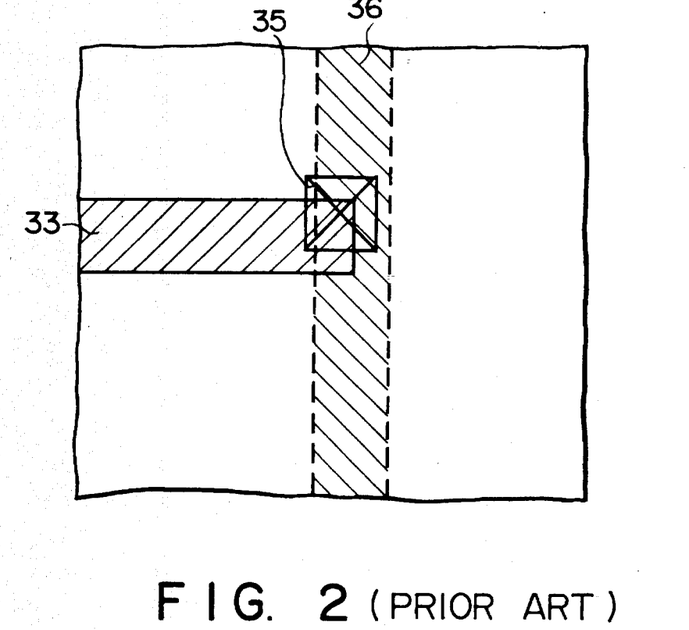
FIG. 2 is a plan view showing a pattern of a semiconductor device manufactured by the conventional method shown in FIGS. 1A to 1D.

In the above conventional method, however, upon formation of the through-hole performed by RIE in the step shown in FIG. 1C, a formation position of the through-hole 35 may be deviated from a correct position on the first wiring layer 33, as shown in a plan view of FIG. 2, due to a mask misalignment or a process variation. If the through-hole 35 is deviated from the correct position in this manner, the silicon oxide film 32 is etched to a portion located below the first wiring layer 33. In this case, a leakage current is produced between the second wiring layer 36 and an underlying polycrystalline silicon wiring layer (not shown) or the silicon substrate 31, or inconveniences such as a short circuit occur in the worst case.

When the second wiring layer 36 is etched to be deviated from the through-hole 35, the first wiring layer 33 is etched to cause a reliability or disconnection defect.

Figure 3:
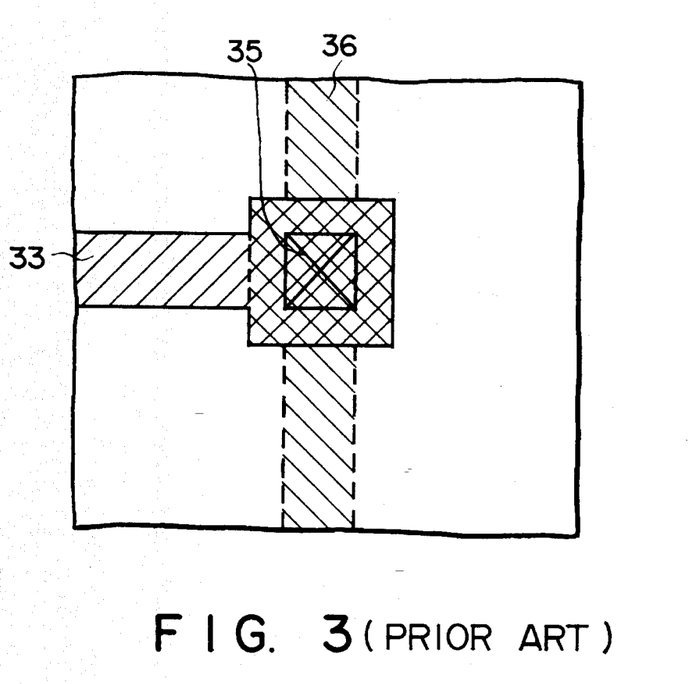
FIG. 3 is a plan view showing a pattern of a conventional semiconductor device different from that shown in FIG. 2.

In order to form a through-hole, therefore, as shown in a plan view of FIG. 3, the wiring width of the first wiring layer 33 at a prospective formation position of the through-hole 35 is set to be much larger than a minimum width of the first wiring layer. That is, a predetermined size margin which can allow a mask misalignment or a process variation is set between the through-hole 35 and the first wiring layer 33. As a result, the above inconveniences do not occur even if the through-hole 35 is deviated from the prospective formation position.

When the wiring width of the first wiring layer at the prospective formation position of the through-hole is increased, as shown in FIG. 3, however, a wiring pitch is inevitably increased to lead to an increase in chip area.

SUMMARY OF THE INVENTION

It is, therefore, an object of the present invention to provide a semiconductor device which can connect different wiring layers without increasing a wiring pitch and therefore has a high-density multilayered wiring structure and a method of manufacturing the same.

According to a first aspect of the present invention, there is provided a semiconductor device having a multilayered wiring structure, comprising a first wiring layer having a predetermined wiring width and formed in a predetermined shape by patterning, a protection layer formed on a side wall of the first wiring layer, an insulating layer covering the first wiring layer, an opening formed in the insulating layer, and having a width equal to or larger than a wiring width of the first wiring layer, and a second wiring layer formed in a predetermined shape by patterning and partially filled in the opening so as to be connected to the first wiring layer.

According to a second aspect of the present invention, there is provided a method of manufacturing a semiconductor device having a multilayered wiring structure, comprising the steps of forming a first wiring layer having a predetermined wiring width and a predetermined shape on a first insulating layer, forming a protection layer on a side wall of the first wiring layer, forming a second insulating layer on the entire surface, forming an opening reaching a surface of the first wiring layer in the second insulating layer, and depositing a conductive layer on the entire surface, and patterning the conductive layer, thus filling the opening and thereby forming a second wiring layer connected to the first wiring layer.

DETAILED DESCRIPTION OF THE PREFERRED EMBODIMENTS

Embodiments of the present invention will be described below with reference to the accompanying drawings.

In a method according to an embodiment shown in FIGS. 4A to 4F, a semiconductor device is manufactured as follows.

Figure 4A:
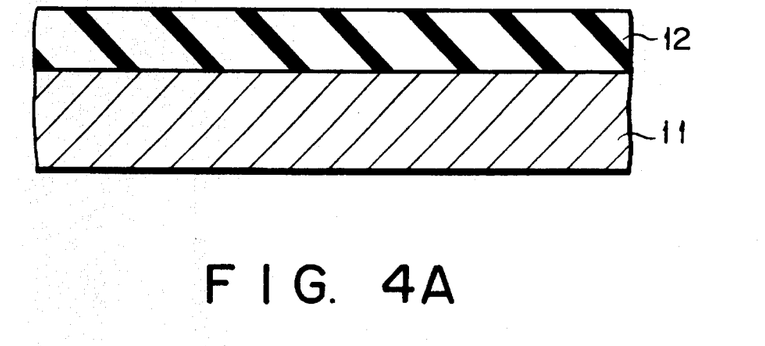
FIGS. 4A to 4F are sectional views showing a method of manufacturing a semiconductor device according to the first embodiment of the present invention in an order of steps.

As shown in FIG. 4A, a silicon oxide layer 12 as an insulating interlayer is deposited on a silicon substrate 11 by a normal- or reduced-pressure CVD method. A silicon oxide layer containing phosphorus or phosphorus and boron is used as the silicon oxide layer 12. The thickness of the layer 12 is about 1 μm.

Figure 4B:
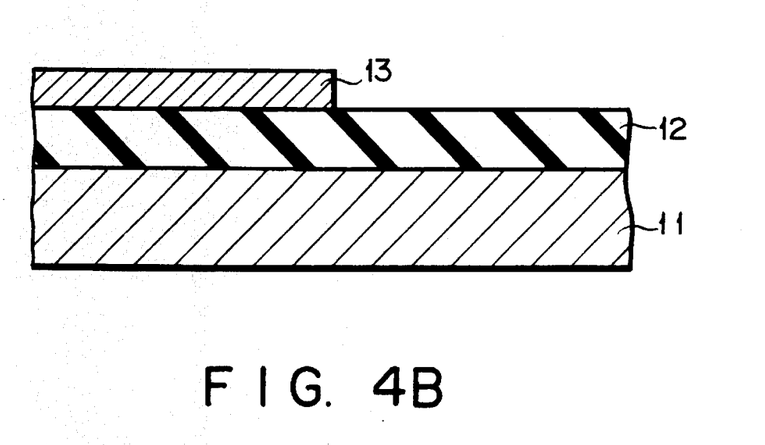

As shown in FIG. 4B, an aluminum-containing layer having a thickness of about 400 to 800 nm is formed on the silicon oxide layer 12 by a sputtering method. This aluminum-containing layer is any one of, e.g., a layer consisting of only aluminum, an alloy layer consisting of aluminum and silicon, and an alloy layer consisting of aluminum, silicon, and copper.

Subsequently, the aluminum-containing layer is selectively removed by a PEP (Photoengraving Process) and RIE to pattern a first wiring layer 13 having a predetermined wiring width and a predetermined shape.

Figure 4C:
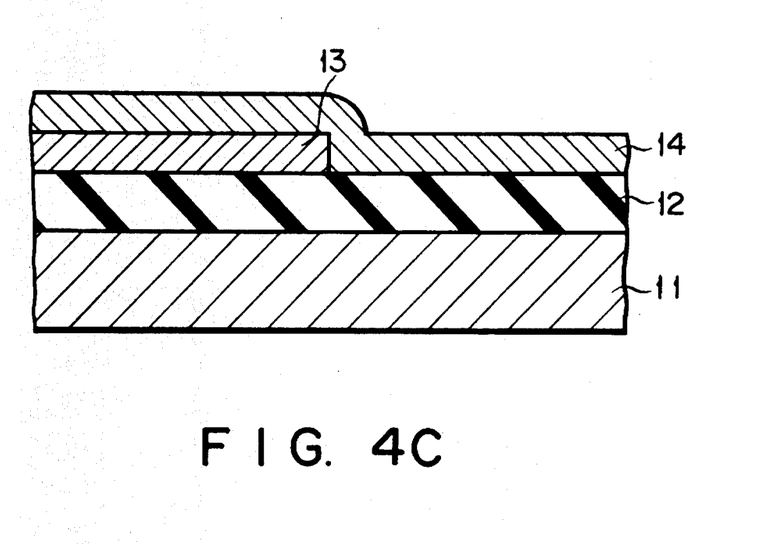

Subsequently, as shown in FIG. 4C, an amorphous silicon layer 14 is deposited to have a thickness of about 200 to 400 nm on the entire surface at a low temperature by a CVD method.

Figure 4D:
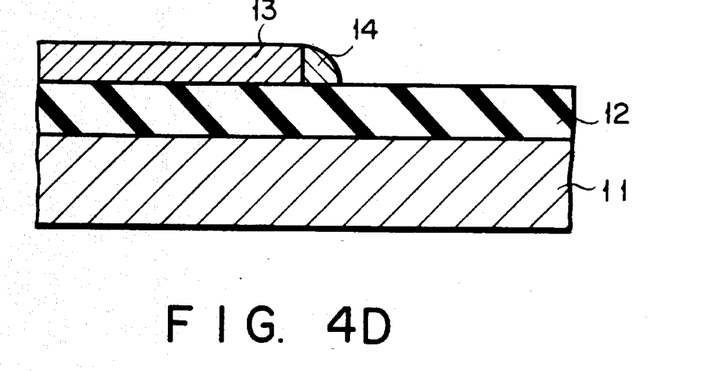

As shown in FIG. 4D, the amorphous silicon layer 14 is selectively removed by an anisotropic RIE method to remain on only the side wall of the first wiring layer 13. The width of the remaining layer 14 is substantially the same as its thickness, i.e., about 200 to 400 nm.

Figure 4E:
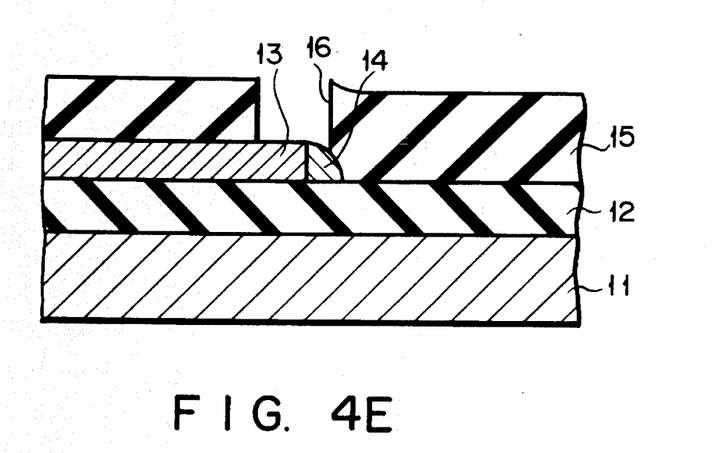

Subsequently, as shown in FIG. 4E, a thick silicon oxide layer 15 is formed as an insulating interlayer on the entire surface. Since the first wiring layer 13 as an underlying layer contains aluminum, the silicon oxide layer 15 is generally formed by a low-temperature plasma CVD method at a temperature of about 300° C. to 350° C. After formation of the silicon oxide layer 15, the surface of the layer 15 is flattened by, e.g., an etch-back method. Subsequently, a through-hole 16 is formed in the layer 15 by PEP and RIE by using a predetermined mask. The opening width of the through-hole 16 is equal to or larger than the wiring width of the first wiring layer 13.

Figure 4F:
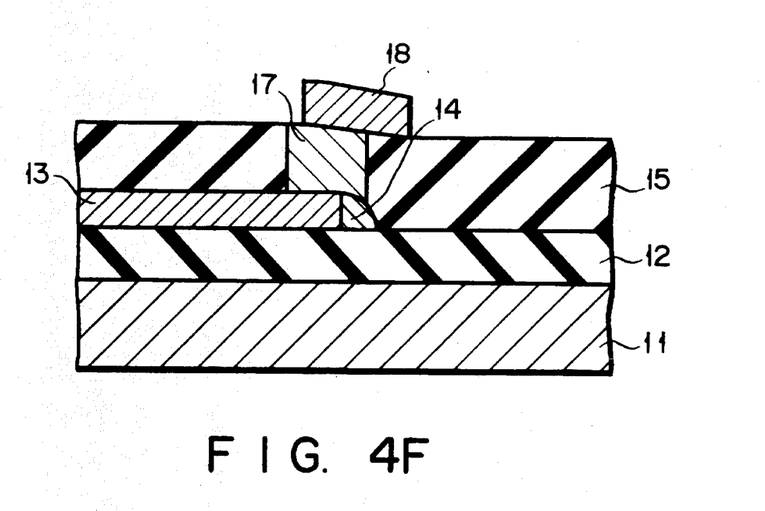

As shown in FIG. 4F, a layer consisting of tungsten as a high-melting metal is selectively grown in the through-hole 16 by a reduced-pressure CVD method using a reduction reaction between WF6 (tungsten hexafluoride) gas and H$_2$ (hydrogen) gas or a reduction reaction between WF6 gas and SiH4 (silane) gas, thereby forming a buried metal layer 17. Thereafter, an alloy layer consisting of aluminum and silicon or an alloy layer consisting of aluminum, silicon, and copper is formed on the entire surface by a sputtering method, and the formed alloy layer is patterned by PEP and RIE, forming a second wiring layer 18.

Figure 5:
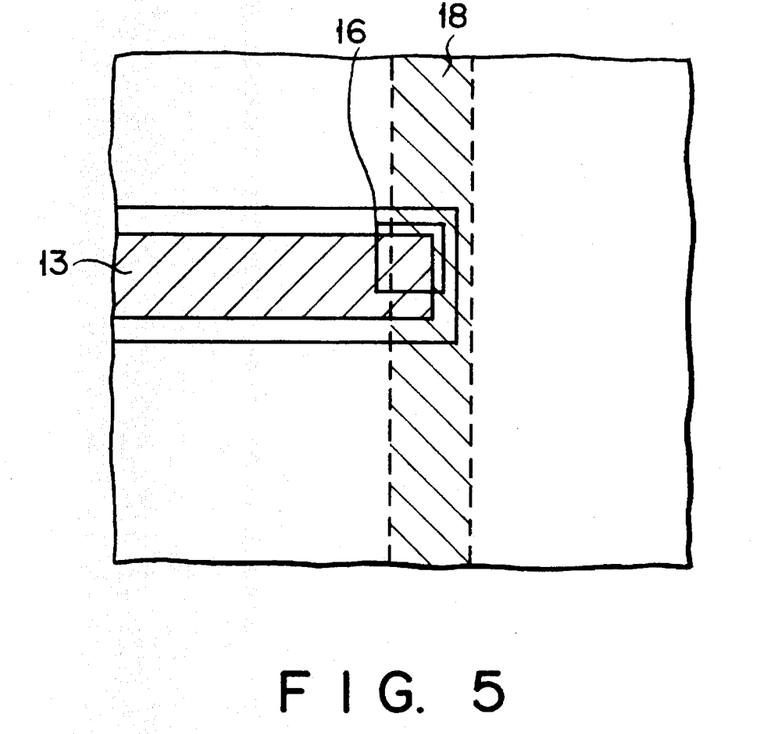
FIG. 5 is a plan view showing a pattern of a semiconductor device of the present invention manufactured by the method shown in FIGS. 4A to 4F.

FIG. 5 is a plan view showing a pattern of the semiconductor device manufactured by the above method and corresponding to FIG. 4F.

In the method of the above embodiment, the amorphous silicon layer 14 is formed on the side wall of the first wiring layer 13. For this reason, upon formation of the through-hole 16, even if a formation position of the through-hole is deviated from the first wiring layer 13, as shown in FIG. 4F or 5, due to a mask misalignment or a process variation, the amorphous silicon layer 14 serves as a stopper to prevent the underlying silicon oxide layer 12 from being etched. For example, with the present standards of technology, a positional deviation amount including a conversion error upon formation of a through-hole is about 200 to 300 nm. When the amorphous silicon layer 14 is formed to have a thickness of about 400 nm, therefore, the layer 14 can be left with a width of about 400 nm corresponding to the film thickness on the side wall of the first wiring layer 13 in the subsequent etching step. Therefore, even if the above degree of positional deviation occurs, the through-hole 16 is not deviated from the remaining amorphous silicon layer 14. As a result, a leakage current between the second wiring layer 18 and a polycrystalline silicon wiring layer or the silicon substrate 11 or a short circuit between the second wiring layer 18 and another wiring layer can be prevented. In addition, when etching is to be performed to pattern the second wiring layer 18, the buried metal layer 17 having a satisfactory selectivity with respect to the second wiring layer 18 is formed in the through-hole 16. For this reason, even if the second wiring layer 18 is formed to be deviated from the through-hole 16, the first wiring layer 13 is not etched by the presence of the buried metal layer 17.

Furthermore, in the method of the above embodiment, since no size margin need be set between the first and second wiring layers 13 and 18 and the through-hole 16, an increase in wiring pitch can be prevented to prevent a chip area from being increased.

In the above embodiment, the amorphous silicon layer 14 is formed on the surface of the silicon oxide layer 12 as an insulating interlayer. Since, however any conductive layer having a satisfactory selectivity with respect to the silicon oxide laver 15 upon etching of the layer 15 may be used, a polycrystalline selicon layer, for example, can be used instead of the amorphous silicon layer.

In addition, in the above embodiment, the buried metal layer 17 for connecting the first and second wiring layers 13 and 18 is formed by a reduced-pressure CVD method. The layer 17, however, may be formed by forming a tungsten layer on the entire surface by a CVD method and then performing an etch-back method.

The second embodiment of the present invention will be described below. A manufacturing method according to the second embodiment is performed in the same manner as that of the first embodiment until a silicon oxide layer 12 as an insulating interlayer is formed on a silicon substrate 11, as shown in FIG. 4A.

Figure 6A:
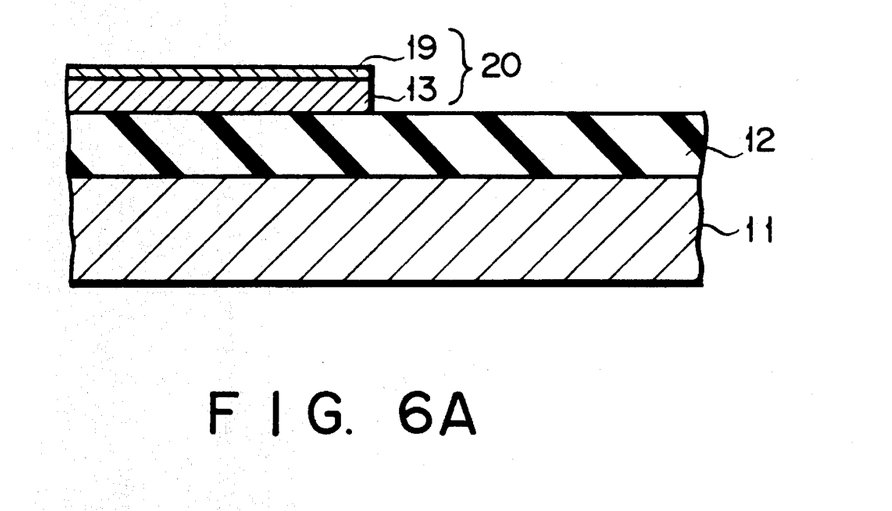
FIGS. 6A to 6E are sectional views showing a method of manufacturing a semiconductor device according to the second embodiment of the present invention in an order of steps.

As shown in FIG. 6A, an aluminum-containing layer 13 having a thickness of about 400 to 800 nm is formed on the silicon oxide layer 12 by a sputtering method, and a tungsten layer 19 is formed thereon. Subsequently, the two metal layers, i.e., the aluminum-containing layer 13 and the tungsten layer 19 as a high-melting metal layer are selectively removed by PEP and RIE to form a first wiring layer 20 having a predetermined wiring width and a predetermined shape by patterning. That is, in this embodiment, the two metal layers are used as the first wiring layer 20.

Figure 6B:
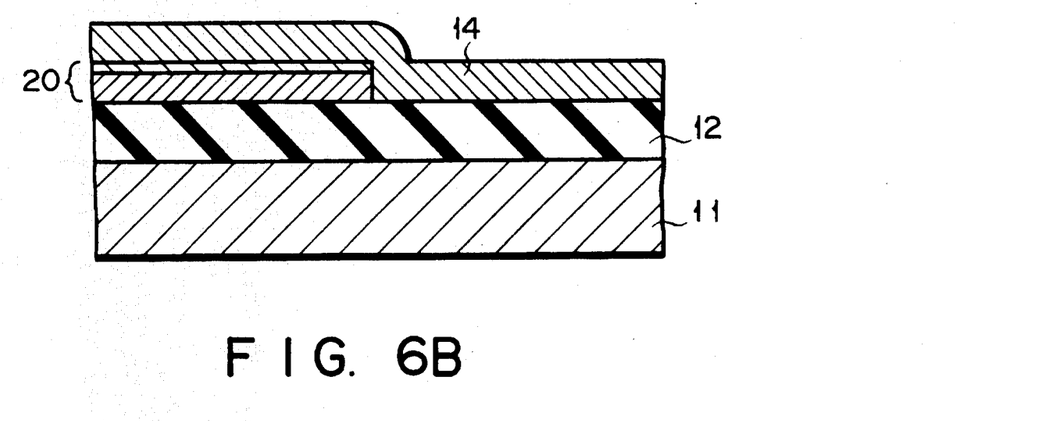

Thereafter, as in the case of the first embodiment, an amorphous silicon layer 14 havin a thickness of about 200 to 400 nm is deposited on the entire surface at a low temperature by a CVD method, as in FIG. 6B.

Figure 6C:
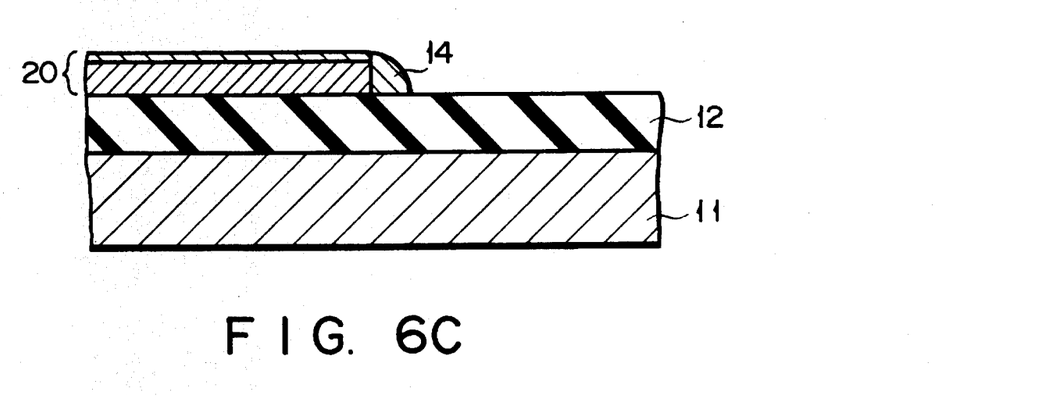

As shown in FIG. 6C, the amorphous silicon layer 14 is selectively removed by an anisotropic RIE method to remain on only the side wall of the first wiring layer 20.

Figure 6D:
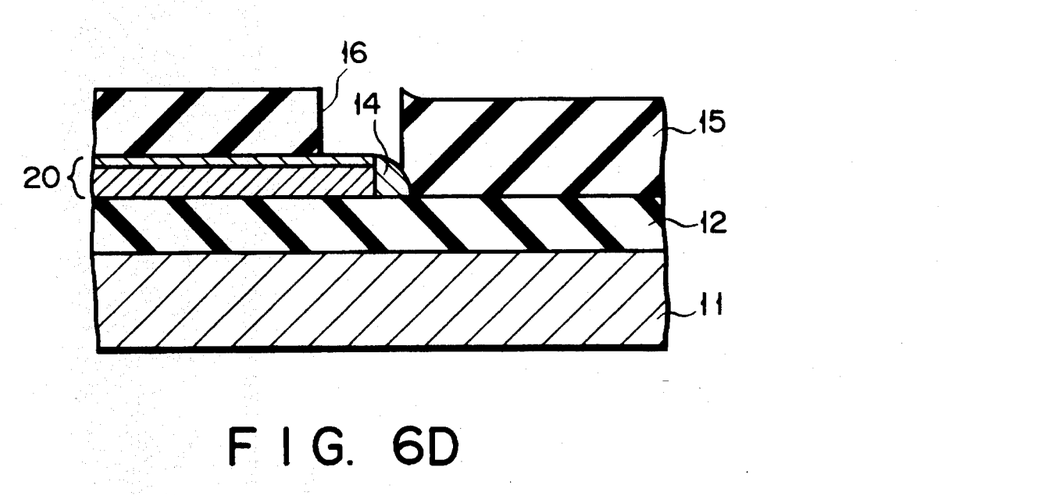

Subsequently, as shown in FIG. 6D, a thick silicon oxide layer 15 as an insulating interlayer is formed on the entire surface. Since one of the two layers constituting the first wiring layer 20 as an underlaying layer contains aluminum, formation of the silicon oxide layer 15 is generally performed by a low-temperature plasma CVD method at a temperature of 300° C. to 350° C. After the formation of the silicon oxide layer 15, the surface of the layer 15 is flattened by, e.g., an etch-back method. Subsequently, a through-hole 16 is formed in the silicon oxide layer 15 by PEP and RIE by using a predetermined mask. The opening width of the through-hole 16 is equal to or larger than the wiring width of the first wiring layer 20.

Figure 6E:
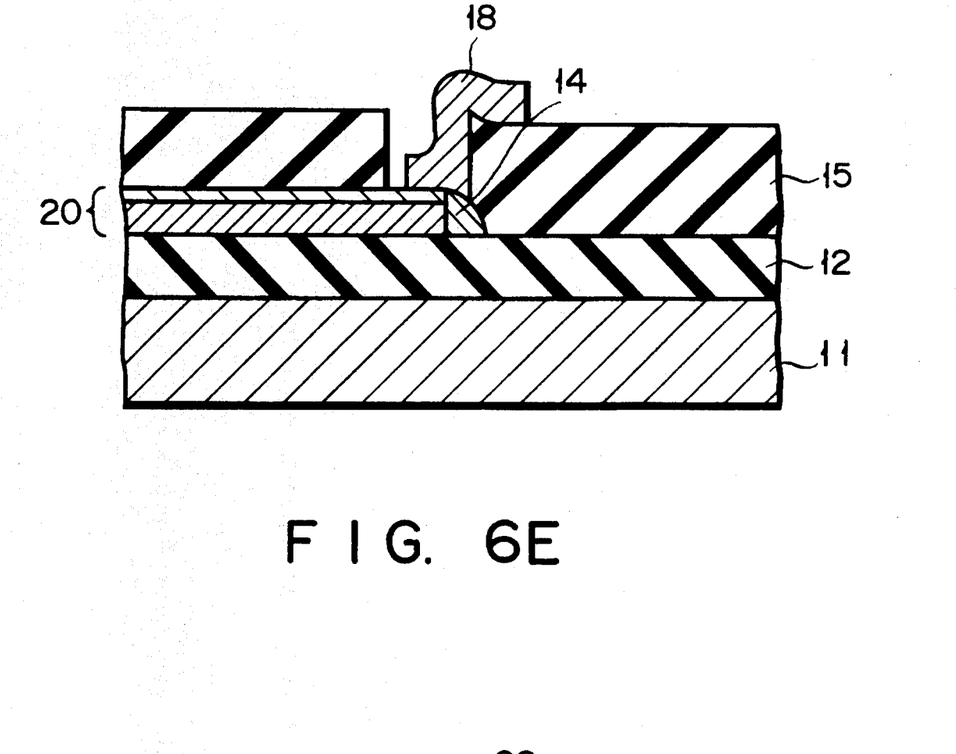

As shown in FIG. 6E, an alloy layer consisting of aluminum and silicon or an alloy layer consisting of aluminum, silicon, and copper is formed on the entire surface by a sputtering method and patterned by PEP and RIE, thereby forming a second wiring layer 18.

That is, in the method of the second embodiment, unlike in the first embodiment, the second wiring layer 18 is directly formed in contact with the first wiring layer 13 without burying a conductive layer in the through-hole 16.

In the second embodiment, the first wiring layer 20 is formed of two layers, i.e., the aluminum-containing layer 13 and the tungsten layer 19. Nevertheless, according to the invention, the first wiring layer 20 can be formed of the tungsten layer 19 only.

Figure 7:
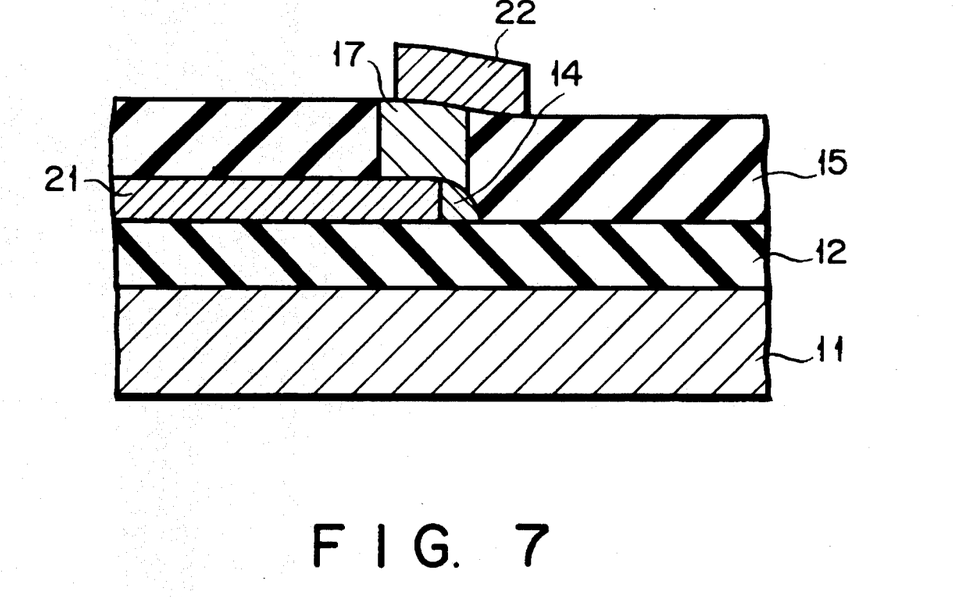
FIG. 7 is a sectional view showing a semiconductor device according to the third embodiment of the present invention.

FIG. 7 shows a semiconductor device according to the third embodiment of the present invention. In the semiconductor device of this embodiment, first and second wiring layers 21 and 23 each consisting of polycrystalline silicon are formed instead of the first and second wiring layers 13 and 18, respectively, of the first embodiment.

Note that the present invention is not limited to the above embodiments but can be variously modified. For example, although the buried metal layer 17 consists of tungsten in each of the above embodiments, any metal can be used as long as it is a high-melting metal and has a low resistivity.

As has been described above, according to the present invention, since a through-hole can be formed without increasing a wiring pitch, a semiconductor device having a high-density multilayered wiring structure and a method of manufacturing the same can be provided.

What is claimed is:

1. A method of manufacturing a semiconductor device having a multilayered wiring structure on a semiconductor substrate, comprising the steps of:

forming a first insulating layer on said semiconductor substrate;

forming a first wiring layer having a selected wiring width and a selected shape on said first insulating layer;

forming a protection layer on a side wall of said first wiring layer;

forming a second insulating layer on the entire surface;

forming an opening having a width equal to or larger than said wiring width of said first wiring layer reaching a surface of said first wiring layer in said second insulating layer by etching, said protection layer serving as a stopper to prevent said first insulating layer from being etched when a formation position of said opening deviates from said first wiring layer;

forming a first conductive layer filling said opening; and forming a second conductive layer on the entire surface and patterning said second conductive layer, thereby forming a second wiring layer partially connected to said first conductive layer.

2. A method according to claim 1, wherein said step of forming said protection layer on said side wall of said first wiring layer includes the substeps of:

forming a silicon layer on the entire surface including said first wiring layer, and etching said silicon layer by an anisotropic etching method, leaving said silicon layer on only said side wall of said first wiring layer.

3. A method according to claim 1, wherein said first conductive layer is formed by a reduced-pressure CVD method.

4. A method of manufacturing a semiconductor device having a multilayered wiring structure on a semiconductor substrate, comprising the steps of:

forming a first insulating layer on said semiconductor substrate;

forming a first wiring layer having a selected wiring width and a selected shape on said first insulating layer;

forming a protection layer on a side wall of said first wiring layer;

forming a second insulating layer on the entire surface;

forming an opening having a width equal to or larger than said wiring width of said first wiring layer reaching a surface of said first wiring layer in said second insulating layer by etching, said protection layer serving as a stopper to prevent said first insulating layer from being etched when a formation position of said opening deviates from said first wiring layer; and depositing a conductive layer on the entire surface and patterning said conductive layer, thus filling said opening and thereby forming a second wiring layer connected to said first wiring layer.

5. A method according to claim 4, wherein said step of forming said protection layer on said side wall of said first wiring layer includes the substeps of:

forming a silicon layer on the entire surface including said first wiring layer, and etching said silicon layer by an anisotropic etching method, leaving said silicon layer on only said side wall of said first wiring layer.

* * * * *